(12) United States Patent
Lee et al.

(10) Patent No.: US 10,897,006 B2
(45) Date of Patent: Jan. 19, 2021

(54) MAGNETIC MEMORY DEVICE AND METHOD FOR MANUFACTURING THE SAME

(71) Applicant: SAMSUNG ELECTRONICS CO., LTD., Suwon-si (KR)

(72) Inventors: Kilho Lee, Busan (KR); Gwanhyeob Koh, Seoul (KR); Yongjae Kim, Seongnam-si (KR); Yoonjong Song, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 45 days.

(21) Appl. No.: 16/286,718

(22) Filed: Feb. 27, 2019

(65) Prior Publication Data

US 2020/0020847 A1 Jan. 16, 2020

(30) Foreign Application Priority Data

Jul. 11, 2018 (KR) .................. 10-2018-0080461

(51) Int. Cl.
*H01L 27/22* (2006.01)
*H01L 43/02* (2006.01)
*H01L 43/12* (2006.01)

(52) U.S. Cl.
CPC ............ *H01L 43/02* (2013.01); *H01L 27/228* (2013.01); *H01L 43/12* (2013.01)

(58) Field of Classification Search
CPC ........ H01L 43/02; H01L 43/12; H01L 27/228
See application file for complete search history.

(56) References Cited

U.S. PATENT DOCUMENTS

| 8,283,186 | B2 | 10/2012 | Kim |
| 8,344,345 | B2 | 1/2013 | Mikawa et al. |
| 9,865,649 | B2 | 1/2018 | Tan et al. |
| 10,243,020 | B1* | 3/2019 | Clevenger ............. H01L 27/228 |
| 2012/0056253 | A1* | 3/2012 | Iwayama ............. H01L 27/228 |
| 2017/0069684 | A1* | 3/2017 | Suh ......................... H01L 43/12 |
| 2017/0092851 | A1 | 3/2017 | Han et al. |
| 2017/0092852 | A1* | 3/2017 | Son ......................... H01L 43/02 |
| 2017/0317143 | A1 | 11/2017 | Chen et al. |
| 2018/0012933 | A1 | 1/2018 | Suh et al. |

FOREIGN PATENT DOCUMENTS

KR 10-1718980 B1 3/2017

* cited by examiner

*Primary Examiner* — Mark W Tornow
(74) *Attorney, Agent, or Firm* — Lee IP Law, P.C.

(57) ABSTRACT

A magnetic memory device including a substrate including a cell region and a peripheral circuit region; a first interlayer insulating layer covering the cell region and the peripheral circuit region of the substrate; interconnection lines in the first interlayer insulating layer; a peripheral conductive line and a peripheral conductive contact on the first interlayer insulating layer on the peripheral circuit region, the peripheral conductive contact being between the peripheral conductive line and a corresponding one of the interconnection lines; a bottom electrode contact on the first interlayer insulating layer on the cell region and connected to a corresponding one of the interconnection lines; and a data storage pattern on the bottom electrode contact, wherein the peripheral conductive line is at a height between a top surface of the bottom electrode contact and a bottom surface of the bottom electrode contact.

19 Claims, 13 Drawing Sheets

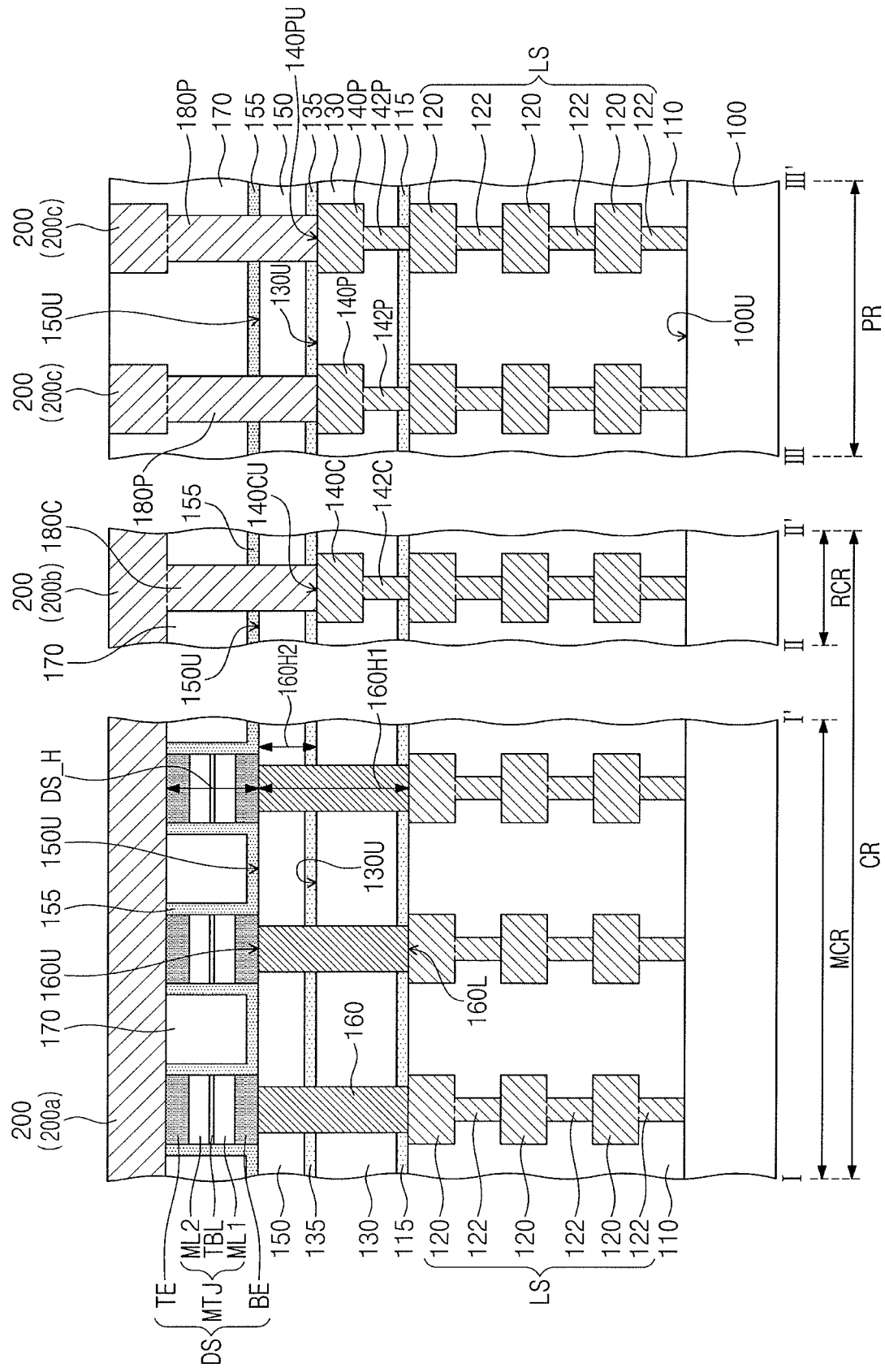

MAGNETIC MEMORY DEVICE AND METHOD FOR MANUFACTURING THE SAME

CROSS-REFERENCE TO RELATED APPLICATION

Korean Patent Application No. 10-2018-0080461, filed on Jul. 11, 2018, in the Korean Intellectual Property Office, and entitled: "Magnetic Memory Device and Method for Manufacturing the Same," is incorporated by reference herein in its entirety.

BACKGROUND

1. Field

Embodiments relate to a magnetic memory device and a method for manufacturing the same.

2. Description of the Related Art

As high-speed and/or low power consumption electronic devices have been demanded, high-speed and/or low-voltage semiconductor memory devices used therein have also been demanded. Magnetic memory devices have been developed as semiconductor memory devices capable of satisfying these demands. The magnetic memory devices may emerge as next-generation semiconductor memory devices because of their high-speed and/or non-volatile characteristics.

A magnetic memory device may include a magnetic tunnel junction (MTJ). The magnetic tunnel junction may include two magnetic layers and an insulating layer between the two magnetic layers. A resistance value of the magnetic tunnel junction may be changed depending on magnetization directions of the two magnetic layers. For example, when the magnetization directions of the two magnetic layers are anti-parallel to each other, the magnetic tunnel junction may have a relatively high resistance value. When the magnetization directions of the two magnetic layers are parallel to each other, the magnetic tunnel junction may have a relatively low resistance value. The magnetic memory device may read/write data using a difference between the resistance values of the magnetic tunnel junction.

SUMMARY

The embodiments may be realized by providing a magnetic memory device including a substrate including a cell region and a peripheral circuit region; a first interlayer insulating layer covering the cell region and the peripheral circuit region of the substrate; interconnection lines in the first interlayer insulating layer; a peripheral conductive line and a peripheral conductive contact on the first interlayer insulating layer on the peripheral circuit region, the peripheral conductive contact being between the peripheral conductive line and a corresponding one of the interconnection lines; a bottom electrode contact on the first interlayer insulating layer on the cell region and connected to a corresponding one of the interconnection lines; and a data storage pattern on the bottom electrode contact, wherein the peripheral conductive line is at a height between a top surface of the bottom electrode contact and a bottom surface of the bottom electrode contact.

The embodiments may be realized by providing a magnetic memory device including a substrate including a cell region and a peripheral circuit region; a first interlayer insulating layer covering the cell region and the peripheral circuit region of the substrate; a lower interconnection structure in the first interlayer insulating layer; a second interlayer insulating layer and a third interlayer insulating layer sequentially stacked on the first interlayer insulating layer; a peripheral conductive line in the second interlayer insulating layer on the peripheral circuit region, the third interlayer insulating layer covering a top surface of the peripheral conductive line; a bottom electrode contact penetrating the second interlayer insulating layer and the third interlayer insulating layer on the cell region, the bottom electrode contact having a top surface located at the same height as or a higher height than a top surface of the third interlayer insulating layer; and a data storage pattern on the top surface of the bottom electrode contact.

BRIEF DESCRIPTION OF THE DRAWINGS

Features will be apparent to those of skill in the art by describing in detail exemplary embodiments with reference to the attached drawings in which:

FIG. 3 illustrates cross-sectional views taken along lines I-I', II-II' and of FIG. 2.

DETAILED DESCRIPTION

Hereinafter, embodiments will be described in detail with reference to the accompanying drawings.

Figure 1:
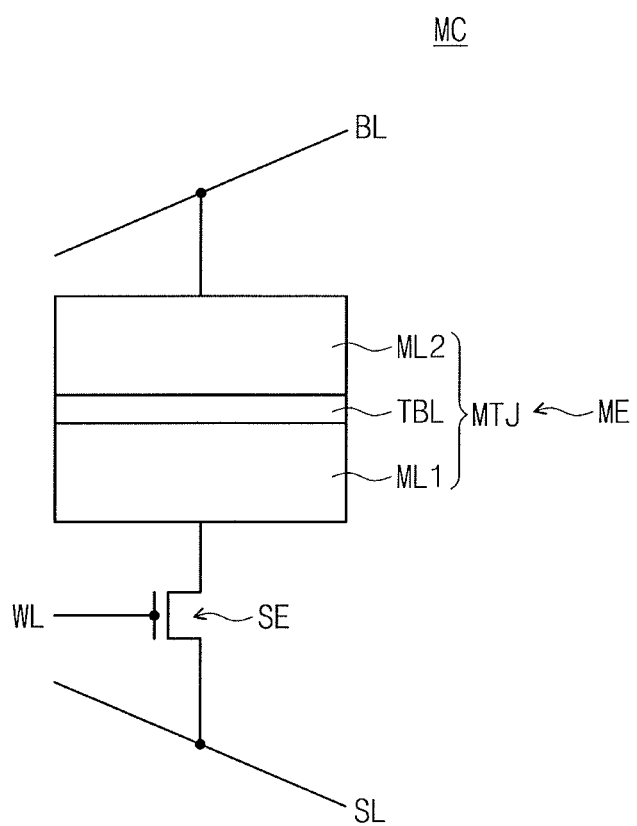
FIG. 1 illustrates a circuit diagram of a unit memory cell of a magnetic memory device according to some embodiments.

FIG. 1 illustrates a circuit diagram of a unit memory cell of a magnetic memory device according to some embodiments.

Referring to FIG. 1, a unit memory cell MC may include a memory device ME and a selection device SE. The memory device ME and the selection device SE may be electrically connected in series to each other. The memory device ME may be connected between a bit line BL and the selection device SE. The selection device SE may be connected between the memory device ME and a source line SL and may be controlled by a word line WL. For example, the selection device SE may include a bipolar transistor or a MOS field effect transistor.

The memory device ME may include a magnetic tunnel junction MTJ which includes magnetic layers ML1 and ML2 spaced apart from each other, and a tunnel barrier layer TBL between the magnetic layers ML1 and ML2. One of the magnetic layers ML1 and ML2 may be a reference layer which has a magnetization direction fixed in one direction regardless of an external magnetic field under normal usage environment. The other of the magnetic layers ML1 and ML2 may be a free layer of which a magnetization direction is changeable between two stable states by an external magnetic field or spin torque of electrons in a program current. An electrical resistance of the magnetic tunnel junction MTJ when the magnetization directions of the reference layer and the free layer are anti-parallel to each other may be much greater than that of the magnetic tunnel junction MTJ when the magnetization directions of the reference layer and the free layer are parallel to each other. For example, the electrical resistance of the magnetic tunnel junction MTJ may be adjusted by changing the magnetization direction of the free layer. Thus, logical data may be stored in the memory device ME of the unit memory cell MC by using an electrical resistance difference according to the magnetization directions of the reference layer and the free layer.

Figure 2:
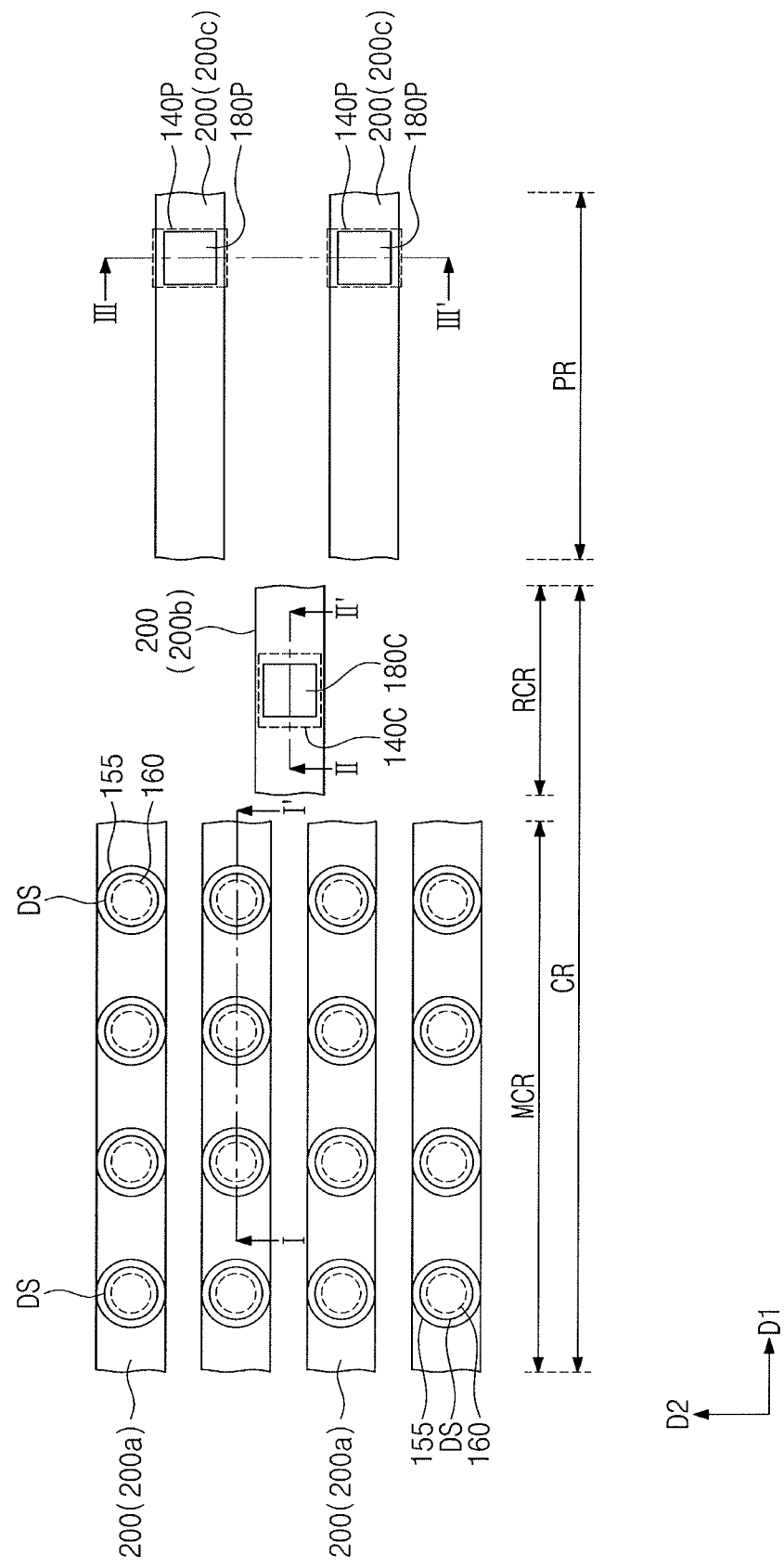
FIG. 2 illustrates a plan view of a magnetic memory device according to some embodiments.
Figure 4A:
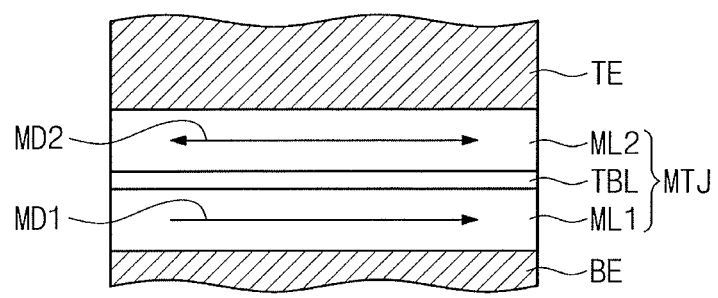
FIGS. 4A and 4B illustrate cross-sectional views of examples of a data storage pattern of FIG. 3.
Figure 4B:
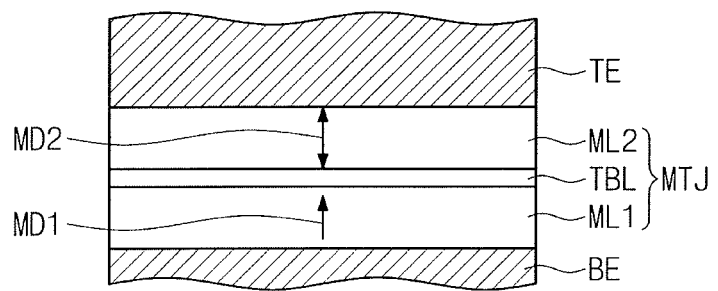

FIG. 2 illustrates a plan view of a magnetic memory device according to some embodiments. FIG. 3 illustrates cross-sectional views taken along lines I-I', II-II' and III-III' of FIG. 2. FIGS. 4A and 4B illustrate cross-sectional views of examples of a data storage pattern of FIG. 3.

Referring to FIGS. 2 and 3, a substrate 100 (including a cell region CR and a peripheral circuit region PR) may be provided. The cell region CR may include a memory cell region MCR and a reference cell region RCR. The memory cell region MCR may be a region of the substrate 100, on which the memory cells MC described with reference to FIG. 1 are provided. The reference cell region RCR may be another region of the substrate 100, on which reference cells (used to sense data stored in the memory cells MC) are provided. For example, a read current may be used to detect an electrical resistance of the memory device ME of each of the memory cells MC (e.g., the electrical resistance according to the magnetization directions of the reference and free layers) described with reference to FIG. 1, and data stored in the memory cells MC may be sensed by comparing the read current with a reference current flowing through the reference cell. The peripheral circuit region PR may be still another region of the substrate 100, on which peripheral circuits (for driving the memory cells MC and the reference cells) are provided. The substrate 100 may be a semiconductor substrate that includes, e.g., silicon, silicon on an insulator (SOI), silicon-germanium (SiGe), germanium (Ge), or gallium-arsenic (GaAs).

In an implementation, a plurality of transistors may be on the substrate 100. Each of the transistors on the memory cell region MCR may be used as the selection device SE of each of the memory cells MC, described with reference to FIG. 1. The transistors on the reference cell region RCR may constitute the reference cells, and the transistors on the peripheral circuit region PR may constitute the peripheral circuits. The transistors may be, e.g., field effect transistors.

A first interlayer insulating layer 110 may be on the substrate 100. The first interlayer insulating layer 110 may be provided on the cell region CR and the peripheral circuit region PR of the substrate 100 to cover the plurality of transistors. The first interlayer insulating layer 110 may include at least one of an oxide layer, a nitride layer, or an oxynitride layer. A lower interconnection structure LS may be provided in the first interlayer insulating layer 110. The lower interconnection structure LS may include interconnection lines 120 and contacts 122 connected to the interconnection lines 120. Lowermost ones of the interconnection lines 120 may be electrically connected to the substrate 100 through the contacts 122 connected to the lowermost interconnection lines 120. In an implementation, the lowermost interconnection lines 120 may be electrically connected to the plurality of transistors through the contacts 122 connected thereto. Uppermost ones of the interconnection lines 120 may be electrically connected to corresponding (e.g., underlying) ones of the interconnection lines 120 through the contacts 122 connected to the uppermost interconnection lines 120. The uppermost interconnection lines 120 may be electrically connected to the lowermost interconnection lines 120 through the contacts 122 and the interconnection lines 120 that are connected to the uppermost interconnection lines 120 (e.g., between the uppermost interconnection lines 120 and the lowermost interconnection lines 120). In an implementation, top surfaces of the uppermost interconnection lines 120 may be substantially coplanar with a top surface of the first interlayer insulating layer 110. The interconnection lines 120 and the contacts 122 may include a metal (e.g., copper) and/or a metal nitride.

A first protective insulating layer 115 and a second interlayer insulating layer 130 may be sequentially stacked on the first interlayer insulating layer 110. The first protective insulating layer 115 and the second interlayer insulating layer 130 may be on the cell region CR and the peripheral circuit region PR of the substrate 100 to cover the top surface of the first interlayer insulating layer 110 and (e.g., at least a part of) the top surfaces of the uppermost interconnection lines 120. The first protective insulating layer 115 may be between the first interlayer insulating layer 110 and the second interlayer insulating layer 130 and may extend between the second interlayer insulating layer 130 and the top surfaces of the uppermost interconnection lines 120. The first protective insulating layer 115 may be in contact with the top surfaces of the uppermost interconnection lines 120. The first protective insulating layer 115 may include a nitride. For example, the first protective insulating layer 115 may include a silicon nitride including carbon (e.g., SiCN). The second interlayer insulating layer 130 may include at least one of an oxide layer, a nitride layer, or an oxynitride layer.

A peripheral conductive line 140P and a peripheral conductive contact 142P may be on the peripheral circuit region PR of the substrate 100. The peripheral conductive line 140P and the peripheral conductive contact 142P may be provided on the first interlayer insulating layer 110 on the peripheral circuit region PR. The peripheral conductive line 140P may penetrate an upper portion of the second interlayer insulating layer 130. A top surface 140PU of the peripheral conductive line 140P may be substantially coplanar with a top surface 130U of the second interlayer insulating layer 130. The peripheral conductive contact 142P may extend downwardly (e.g., toward the substrate 100) from a bottom surface of the peripheral conductive line 140P to penetrate a lower portion of the second interlayer insulating layer 130 and the first protective insulating layer 115. The peripheral conductive contact 142P may be connected to a corresponding (e.g., underlying) one of the uppermost interconnection lines 120. The peripheral conductive contact 142P may be between the corresponding uppermost interconnection line 120 and the peripheral conductive line 140P to connect the peripheral conductive line 140P to the corresponding uppermost interconnection line 120.

The peripheral conductive contact 142P may include the same material as the peripheral conductive line 140P. The peripheral conductive contact 142P and the peripheral conductive line 140P may include a metal (e.g., copper). The peripheral conductive contact 142P and the peripheral conductive line 140P may further include a conductive metal nitride. In an implementation, the peripheral conductive contact 142P and the peripheral conductive line 140P may be in contact with each other to constitute a single unitary body (e.g., may have a monolithic, one-piece structure). For example, the peripheral conductive contact 142P may be in contact with the peripheral conductive line 140P without an interface therebetween.

A cell conductive line 140C and a cell conductive contact 142C may be on the reference cell region RCR of the substrate 100. The cell conductive line 140C and the cell conductive contact 142C may be on the first interlayer insulating layer 110 that is on the reference cell region RCR. The cell conductive line 140C may penetrate an upper portion of the second interlayer insulating layer 130. A top surface 140CU of the cell conductive line 140C may be substantially coplanar with the top surface 130U of the second interlayer insulating layer 130. The top surface 140CU of the cell conductive line 140C may be at substantially the same height as the top surface 140PU of the peripheral conductive line 140P (e.g., from the substrate 100). In the present specification, the term 'height' may mean a distance measured from a top surface 100U of the substrate 100 in a direction perpendicular to the top surface 100U of the substrate 100. The top surface 140CU of the cell conductive line 140C and the top surface 140PU of the peripheral conductive line 140P may be located at substantially the same height as the top surface 130U of the second interlayer insulating layer 130. The cell conductive contact 142C may extend downwardly from a bottom surface of the cell conductive line 140C to penetrate a lower portion of the second interlayer insulating layer 130 and the first protective insulating layer 115. The cell conductive contact 142C may be connected to a corresponding one of the uppermost interconnection lines 120. The cell conductive contact 142C may be between the corresponding uppermost interconnection line 120 and the cell conductive line 140C to connect the cell conductive line 140C to the corresponding uppermost interconnection line 120.

The cell conductive contact 142C may include the same material as the cell conductive line 140C. The cell conductive contact 142C and the cell conductive line 140C may include a metal (e.g., copper). The cell conductive contact 142C and the cell conductive line 140C may further include a conductive metal nitride. In an implementation, the cell conductive contact 142C and the cell conductive line 140C may be in contact with each other to constitute a single unitary body. For example, the cell conductive contact 142C may be in contact with the cell conductive line 140C without an interface therebetween.

The cell conductive contact 142C, the cell conductive line 140C, the peripheral conductive contact 142P, and the peripheral conductive line 140P may include the same material. The cell conductive contact 142C, the cell conductive line 140C, the peripheral conductive contact 142P, and the peripheral conductive line 140P may include the same material as the interconnection lines 120 and the contacts 122 of the lower interconnection structure LS. The cell conductive contact 142C, the cell conductive line 140C, the peripheral conductive contact 142P, the peripheral conductive line 140P, the interconnection lines 120, and the contacts 122 may include a metal (e.g., copper). The cell conductive line 140C may be at substantially the same height as the peripheral conductive line 140P, and the cell conductive contact 142C may be at substantially the same height as the peripheral conductive contact 142P.

A second protective insulating layer 135 and a third interlayer insulating layer 150 may be sequentially stacked on the second interlayer insulating layer 130. The second protective insulating layer 135 and the third interlayer insulating layer 150 may be on the cell region CR and the peripheral circuit region PR of the substrate 100 to cover the top surface 130U of the second interlayer insulating layer 130, a part of the top surface 140PU of the peripheral conductive line 140P, and a part of the top surface 140CU of the cell conductive line 140C. The second protective insulating layer 135 may be between the second and third interlayer insulating layers 130 and 150 and may extend between the third interlayer insulating layer 150 and the top surface 140PU of the peripheral conductive line 140P and between the third interlayer insulating layer 150 and the top surface 140CU of the cell conductive line 140C. The second protective insulating layer 135 may be in contact with the top surface 140PU of the peripheral conductive line 140P and the top surface 140CU of the cell conductive line 140C. For example, the second protective insulating layer 135 may include a nitride (e.g., a silicon nitride including carbon). The third interlayer insulating layer 150 may include at least one of an oxide layer, a nitride layer, or an oxynitride layer.

Bottom electrode contacts 160 may be on the memory cell region MCR of the substrate 100. The bottom electrode contacts 160 may be on the first interlayer insulating layer 110 that is on the memory cell region MCR. Each of the bottom electrode contacts 160 may penetrate the first protective insulating layer 115, the second interlayer insulating layer 130, the second protective insulating layer 135, and the third interlayer insulating layer 150 and may be connected to a corresponding one of the uppermost interconnection lines 120. Each of the bottom electrode contacts 160 may be electrically connected to one terminal of a corresponding one of the plurality of transistors through corresponding ones of the interconnection lines 120 and corresponding ones of the contacts 122. The bottom electrode contacts 160 may be spaced apart from each other (e.g., may be arranged) in first and second directions D1 and D2 parallel to the top surface 100U of the substrate 100 when viewed in a plan view. The first direction D1 and the second direction D2 may intersect each other.

Top surfaces 160U of the bottom electrode contacts 160 may be substantially coplanar with a top surface 150U of the third interlayer insulating layer 150. In an implementation, the top surfaces 160U of the bottom electrode contacts 160 may be located at substantially the same height as the top surface 150U of the third interlayer insulating layer 150. The top surfaces 160U of the bottom electrode contacts 160 may be at a higher height than the top surface 140PU of the peripheral conductive line 140P and the top surface 140CU of the cell conductive line 140C. Bottom surfaces 160L of the bottom electrode contacts 160 may be in contact with corresponding ones of the uppermost interconnection lines 120, respectively. The peripheral conductive line 140P and the cell conductive line 140C may be at a height between the top surfaces 160U of the bottom electrode contacts 160 and the bottom surfaces 160L of the bottom electrode contacts 160. For example, the peripheral conductive line 140P and the cell conductive line 140C may have a lower surface that is farther from the substrate 100 than the bottom surfaces 160L of the bottom electrode contacts 160 and may have an upper surface that is closer to the substrate than the top surfaces 160U of the bottom electrode contacts 160.

The bottom electrode contacts 160 may include at least one of a doped semiconductor material (e.g., doped silicon), a metal (e.g., tungsten, titanium, copper, and/or tantalum), a conductive metal nitride (e.g., titanium nitride, tantalum nitride, and/or tungsten nitride), or a metal-semiconductor compound (e.g., a metal silicide). In an implementation, the bottom electrode contacts 160 may include the same material as the cell conductive contact 142C, the cell conductive line 140C, the peripheral conductive contact 142P, and the peripheral conductive line 140P. In an implementation, the bottom electrode contacts 160 may include a different material from those of the cell conductive contact 142C, the cell conductive line 140C, the peripheral conductive contact 142P, and the peripheral conductive line 140P.

Data storage patterns DS may be on the memory cell region MCR of the substrate 100. The data storage patterns DS may be on the third interlayer insulating layer 150 that is on the memory cell region MCR. The data storage patterns DS may be on the top surfaces 160U of the bottom electrode contacts 160, respectively. The data storage patterns DS may be spaced apart from each other and may be arranged in the first direction D1 and the second direction D2 when viewed in a plan view. The data storage patterns DS may be connected to the bottom electrode contacts 160, respectively. Each of the data storage patterns DS may include a magnetic tunnel junction pattern MTJ, a bottom electrode BE between the magnetic tunnel junction pattern MTJ and each of the bottom electrode contacts 160, and a top electrode TE on the magnetic tunnel junction pattern MTJ. The top electrode TE may be spaced apart from the bottom electrode BE with the magnetic tunnel junction pattern MTJ therebetween. In an implementation, the bottom electrode BE may be in direct contact with the top surface 160U of a corresponding one of the bottom electrode contacts 160. The bottom electrode BE and the top electrode TE may include a conductive metal nitride (e.g., titanium nitride or tantalum nitride).

Referring to FIGS. 4A and 4B, the magnetic tunnel junction pattern MTJ may include a reference layer ML1, a free layer ML2, and a tunnel barrier layer TBL between the reference layer ML1 and the free layer ML2. The reference layer ML1 may have a magnetization direction MD1 fixed in one direction, and the free layer ML2 may have a magnetization direction MD2 changeable to be parallel or anti-parallel to the magnetization direction MD1 of the reference layer ML1. In an implementation, as illustrated in FIGS. 4A and 4B, the free layer ML2 may be between the tunnel barrier layer TBL and the top electrode TE. In an implementation, the free layer ML2 may be between the tunnel barrier layer TBL and the bottom electrode BE. In an implementation, as illustrated in FIG. 4A, the magnetization directions MD1 and MD2 of the reference layer ML1 and the free layer ML2 may be substantially parallel to an interface between the tunnel barrier layer TBL and the free layer ML2. In this case, each of the reference layer ML1 and the free layer ML2 may include a ferromagnetic material. The reference layer ML1 may further include an antiferromagnetic material for fixing or pinning a magnetization direction of the ferromagnetic material included in the reference layer ML1. In an implementation, as illustrated in FIG. 4B, the magnetization directions MD1 and MD2 of the reference layer ML1 and the free layer ML2 may be substantially perpendicular to the interface between the tunnel barrier layer TBL and the free layer ML2. In this case, each of the reference layer ML1 and the free layer ML2 may include at least one of a perpendicular magnetic material (e.g., CoFeTb, CoFeGd, or CoFeDy), a perpendicular magnetic material having a $L1_0$ structure, a CoPt alloy having a hexagonal close packed (HCP) lattice structure, or a perpendicular magnetic structure. The perpendicular magnetic material having the $L1_0$ structure may include at least one of FePt having the $L1_0$ structure, FePd having the $L1_0$ structure, CoPd having the $L1_0$ structure, or CoPt having the $L1_0$ structure. The perpendicular magnetic structure may include magnetic layers and non-magnetic layers, which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" denotes the number of bilayers. The tunnel barrier layer TBL may include at least one of a magnesium oxide (MgO) layer, a titanium oxide (TiO) layer, an aluminum oxide (AlO) layer, a magnesium-zinc oxide (MgZnO) layer, or a magnesium-boron oxide (MgBO) layer.

Referring again to FIGS. 2 and 3, a fourth interlayer insulating layer 170 may be on the third interlayer insulating layer 150 to cover the data storage patterns DS. The fourth interlayer insulating layer 170 may be on the cell region CR and the peripheral circuit region PR of the substrate 100 to cover the top surface 150U of the third interlayer insulating layer 150. A capping insulating layer 155 may be between a sidewall of each of the data storage patterns DS and the fourth interlayer insulating layer 170. The capping insulating layer 155 may surround the sidewall of each of the data storage patterns DS when viewed in a plan view. The capping insulating layer 155 may extend from the sidewall of each of the data storage patterns DS into between the third interlayer insulating layer 150 and the fourth interlayer insulating layer 170. The capping insulating layer 155 may cover the top surface 150U of the third interlayer insulating layer 150 between the data storage patterns DS on the memory cell region MCR and may cover the top surface 150U of the third interlayer insulating layer 150 on the reference cell region RCR and the peripheral circuit region PR. The capping insulating layer 155 may include a nitride (e.g., silicon nitride), and the fourth interlayer insulating layer 170 may include at least one of an oxide layer, a nitride layer, or an oxynitride layer.

Upper interconnection lines 200 may be in the fourth interlayer insulating layer 170. The upper interconnection lines 200 may include first upper interconnection lines 200a in the fourth interlayer insulating layer 170 on the memory cell region MCR, a second upper interconnection line 200b in the fourth interlayer insulating layer 170 on the reference cell region RCR, and a third upper interconnection line 200c in the fourth interlayer insulating layer 170 on the peripheral circuit region PR. The first upper interconnection lines 200a may extend in the first direction D1 and may be spaced apart from each other in the second direction D2. Each of the first upper interconnection lines 200a may be connected in common to the data storage patterns DS arranged in the first direction D1. Each of the second and third upper interconnection lines 200b and 200c may extend in the first direction D1. The upper interconnection lines 200 may include a metal (e.g., copper). The upper interconnection lines 200 may further include a conductive metal nitride. The upper interconnection lines 200 may function as bit lines.

A cell contact plug 180C may be on the reference cell region RCR of the substrate 100 and may be connected to the second upper interconnection line 200b. The cell contact plug 180C may extend downwardly from a bottom surface of the second upper interconnection line 200b to penetrate the fourth interlayer insulating layer 170, the capping insulating layer 155, the third interlayer insulating layer 150, and the second protective insulating layer 135. The cell contact plug 180C may be connected to the cell conductive line 140C and may be in contact with the top surface 140CU of the cell conductive line 140C. The cell contact plug 180C may include the same material as the second upper interconnection line 200b. The cell contact plug 180C may include a metal (e.g., copper). The cell contact plug 180C may further include a conductive metal nitride. In an implementation, the cell contact plug 180C and the second upper interconnection line 200b may be in contact with each other to constitute a single unitary body. For example, the cell contact plug 180C may be in contact with the second upper interconnection line 200b without an interface therebetween.

A peripheral contact plug 180P may be on the peripheral circuit region PR of the substrate 100 and may be connected to the third upper interconnection line 200c. The peripheral contact plug 180P may extend downwardly from a bottom surface of the third upper interconnection line 200c to penetrate the fourth interlayer insulating layer 170, the capping insulating layer 155, the third interlayer insulating layer 150, and the second protective insulating layer 135. The peripheral contact plug 180P may be connected to the peripheral conductive line 140P and may be in contact with the top surface 140PU of the peripheral conductive line 140P. The peripheral contact plug 180P may include the same material as the third upper interconnection line 200c. The peripheral contact plug 180P may include a metal (e.g., copper). The peripheral contact plug 180P may further include a conductive metal nitride. In an implementation, the peripheral contact plug 180P and the third upper interconnection line 200c may be in contact with each other to constitute a single unitary body. For example, the peripheral contact plug 180P may be in contact with the third upper interconnection line 200c without an interface therebetween.

When the bottom electrode contacts 160, the data storage patterns DS, the cell contact plug 180C and the peripheral contact plug 180P are between the lower interconnection structure LS and the upper interconnection lines 200, each of the cell and peripheral contact plugs 180C and 180P may have a vertical height corresponding to a sum of a vertical height 160H1 of the bottom electrode contact 160 and a vertical height DS_H of the data storage pattern DS. If the vertical height 160H1 of the bottom electrode contact 160 were to increase, an aspect ratio of the cell and peripheral contact plugs 180C and 180P could also increase, and thus it may be difficult to form the cell and peripheral contact plugs 180C and 180P. If the vertical height 160H1 of the bottom electrode contact 160 were to be reduced, a metal element in the uppermost interconnection lines 120 could be diffused to the data storage patterns DS through the bottom electrode contacts 160 to cause defects in the data storage patterns DS, and/or the bottom electrode contacts 160 could be pulled out or broken in a planarization process for forming the bottom electrode contacts 160.

According to some embodiments, the cell conductive line 140C and the peripheral conductive line 140P may be provided in the second interlayer insulating layer 130, and a lower portion of each of the bottom electrode contacts 160 may be embedded in the second interlayer insulating layer 130. For example, each of the bottom electrode contacts 160 may be partially embedded in the second interlayer insulating layer 130. The cell contact plug 180C and the peripheral contact plug 180P may be on the cell conductive line 140C and the peripheral conductive line 140P, respectively. In this case, each of the cell and peripheral contact plugs 180C and 180P may have a vertical height corresponding to a sum of a vertical height 160H2 of only an upper portion of each of the bottom electrode contacts 160 and the vertical height DS_H of each of the data storage patterns DS. For example, the vertical heights 160H1 of the bottom electrode contacts 160 may be maintained and, at the same time, the aspect ratio of the cell and peripheral contact plugs 180C and 180P may be reduced. For example, it is possible to help minimize or prevent the defects which could otherwise be caused when the vertical height 160H1 of the bottom electrode contact 160 is reduced, and the cell and peripheral contact plugs 180C and 180P may be easily formed.

FIGS. 5 to 11 illustrate cross-sectional views corresponding to the lines I-I', II-II' and of FIG. 2 to show stages in a method for manufacturing a magnetic memory device according to some embodiments. Hereinafter, the descriptions to the same technical features as mentioned with reference to FIGS. 2, 3, 4A and 4B will be omitted or mentioned briefly for the purpose of ease and convenience in explanation.

Figure 5:
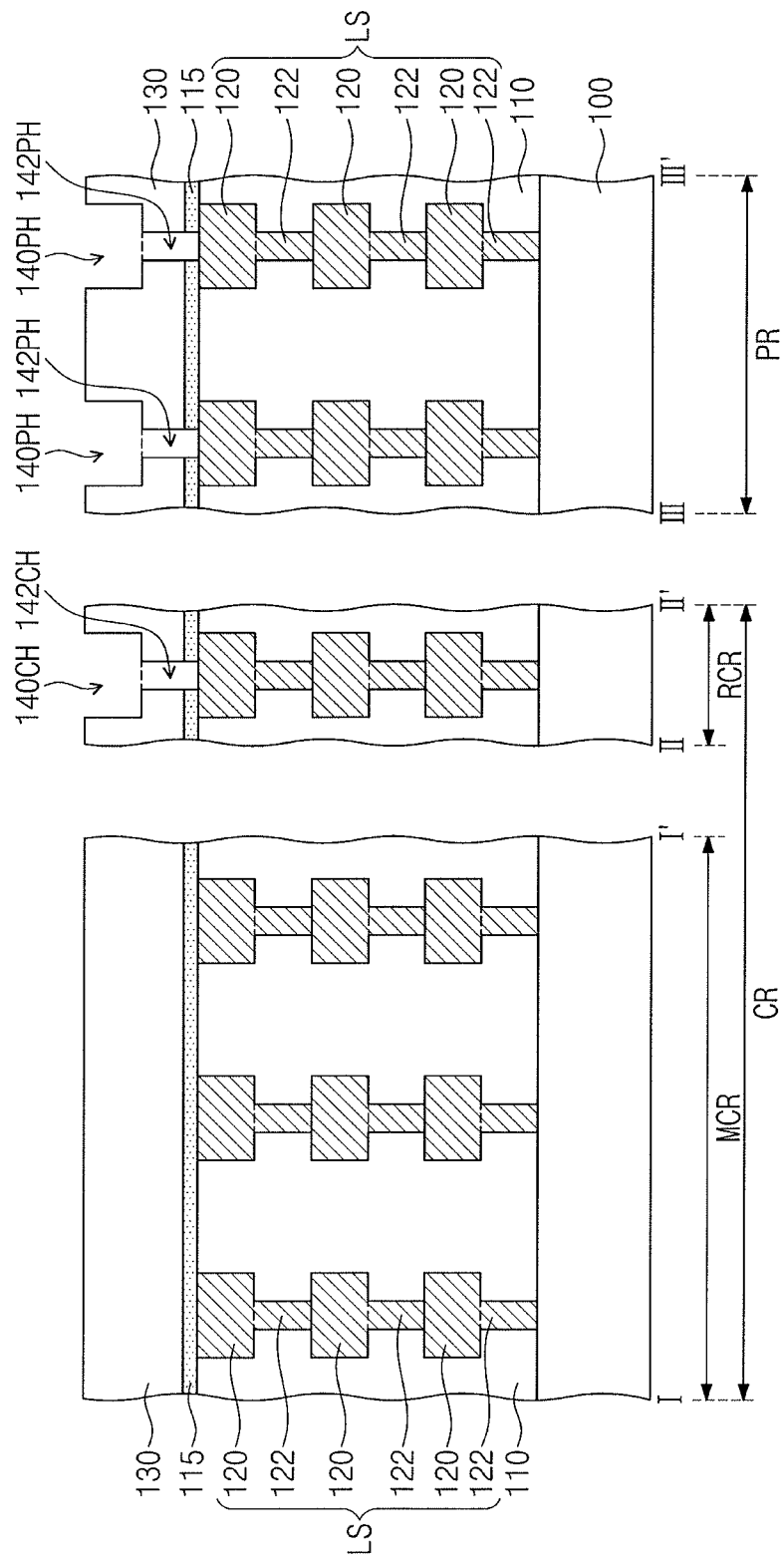
FIGS. 5 to 11 illustrate cross-sectional views corresponding to the lines I-I', II-II' and III-III' of FIG. 2 showing stages in a method for manufacturing a magnetic memory device according to some embodiments.

Referring to FIGS. 2 and 5, a plurality of transistors and a lower interconnection structure LS may be formed on a substrate 100. The substrate 100 may include a cell region CR and a peripheral circuit region PR, and the cell region CR may include a memory cell region MCR and a reference cell region RCR. The plurality of transistors may be, e.g., field effect transistors. The lower interconnection structure LS may include interconnection lines 120 and contacts 122 connected to the interconnection lines 120. Lowermost ones of the interconnection lines 120 may be electrically connected to the substrate 100 through the contacts 122 connected to the lowermost interconnection lines 120. In an implementation, the lowermost interconnection lines 120 may be electrically connected to the plurality of transistors through the contacts 122 connected thereto. Uppermost ones of the interconnection lines 120 may be electrically connected to corresponding ones of the interconnection lines 120 through the contacts 122 connected to the uppermost interconnection lines 120. The uppermost interconnection lines 120 may be electrically connected to the lowermost interconnection lines 120 through the contacts 122 and the interconnection lines 120 which are connected to the uppermost interconnection lines 120. A first interlayer insulating layer 110 may be formed on the substrate 100 to cover the plurality of transistors and the lower interconnection structure LS. In an implementation, top surfaces of the uppermost interconnection lines 120 may be substantially coplanar with a top surface of the first interlayer insulating layer 110.

A first protective insulating layer 115 and a second interlayer insulating layer 130 may be sequentially formed on the first interlayer insulating layer 110. The first protective insulating layer 115 may cover the top surface of the first interlayer insulating layer 110 and the top surfaces of the uppermost interconnection lines 120 on the cell region CR and the peripheral circuit region PR of the substrate 100. The second interlayer insulating layer 130 may cover a top surface of the first protective insulating layer 115 on the cell region CR and the peripheral circuit region PR of the substrate 100. A peripheral trench 140PH and a peripheral contact hole 142PH may be formed in the second interlayer insulating layer 130 on the peripheral circuit region PR. The peripheral trench 140PH may penetrate an upper portion of the second interlayer insulating layer 130, and the peripheral contact hole 142PH may extend downwardly from a bottom surface of the peripheral trench 140PH to penetrate a lower portion of the second interlayer insulating layer 130 and the first protective insulating layer 115. The peripheral contact hole 142PH may expose a top surface of a corresponding one of the uppermost interconnection lines 120. A cell trench 140CH and a cell contact hole 142CH may be formed in the second interlayer insulating layer 130 on the reference cell region RCR. The cell trench 140CH may penetrate an upper portion of the second interlayer insulating layer 130, and the cell contact hole 142CH may extend downwardly from a bottom surface of the cell trench 140CH to penetrate a lower portion of the second interlayer insulating layer 130 and the first protective insulating layer 115. The cell contact hole 142CH may expose a top surface of a corresponding one of the uppermost interconnection lines 120.

The peripheral trench 140PH and the cell trench 140CH may be formed at the same time. For example, the formation of the peripheral trench 140PH and the cell trench 140CH may include forming a first mask pattern having openings defining the peripheral trench 140PH and the cell trench 140CH on the second interlayer insulating layer 130, and etching an upper portion of the second interlayer insulating layer 130 using the first mask pattern as an etch mask. The first mask pattern may be removed after the formation of the peripheral trench 140PH and the cell trench 140CH. The peripheral contact hole 142PH and the cell contact hole 142CH may be formed at the same time. For example, the formation of the peripheral contact hole 142PH and the cell contact hole 142CH may include forming a sacrificial layer filling the peripheral trench 140PH and the cell trench 140CH on the second interlayer insulating layer 130, forming a second mask pattern having openings defining the peripheral contact hole 142PH and the cell contact hole 142CH on the sacrificial layer, and etching the sacrificial layer, a lower portion of the second interlayer insulating layer 130, and the first protective insulating layer 115 by using the second mask pattern as an etch mask. The second mask pattern and the sacrificial layer may be removed after the formation of the peripheral contact hole 142PH and the cell contact hole 142CH.

Figure 6:
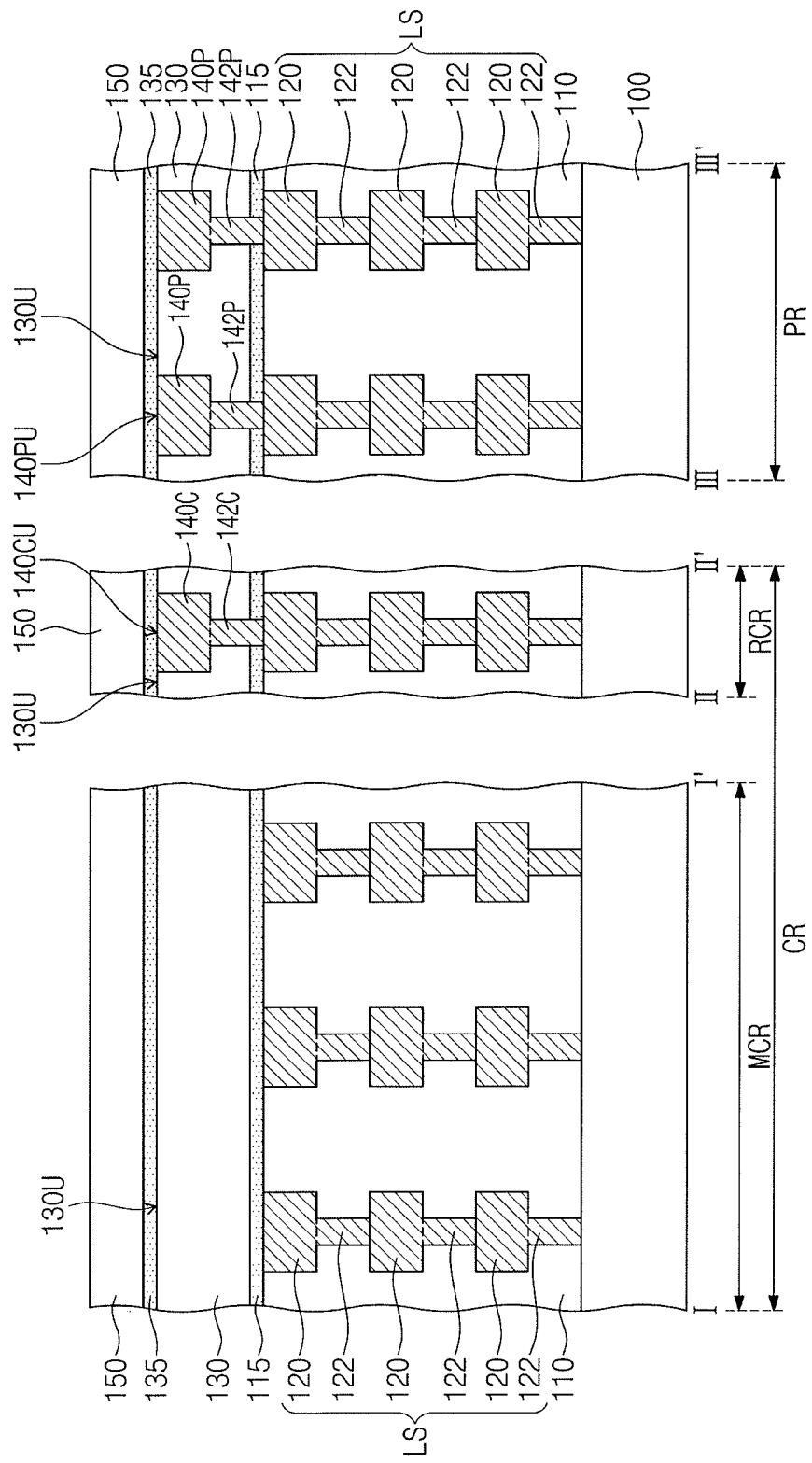

Referring to FIGS. 2 and 6, a peripheral conductive line 140P and a peripheral conductive contact 142P may be formed in the peripheral trench 140PH and the peripheral contact hole 142PH, respectively, and a cell conductive line 140C and a cell conductive contact 142C may be formed in the cell trench 140CH and the cell contact hole 142CH, respectively. The cell conductive contact 142C, the cell conductive line 140C, the peripheral conductive contact 142P and the peripheral conductive line 140P may be formed at the same time. For example, the formation of the cell conductive contact 142C, the cell conductive line 140C, the peripheral conductive contact 142P and the peripheral conductive line 140P may include forming a conductive layer filling the cell trench 140CH, the cell contact hole 142CH, the peripheral trench 140PH, and the peripheral contact hole 142PH on the second interlayer insulating layer 130, and planarizing the conductive layer until a top surface 130U of the second interlayer insulating layer 130 is exposed. The conductive layer may include a metal (e.g., copper) and a conductive metal nitride. A top surface 140CU of the cell conductive line 140C and a top surface 140PU of the peripheral conductive line 140P may be substantially coplanar with the top surface 130U of the second interlayer insulating layer 130 by the planarization process. The top surface 140CU of the cell conductive line 140C may be located at substantially the same height as the top surface 140PU of the peripheral conductive line 140P from the substrate 100.

A second protective insulating layer 135 and a third interlayer insulating layer 150 may be sequentially formed on the second interlayer insulating layer 130. The second protective insulating layer 135 may cover the top surface 130U of the second interlayer insulating layer 130, the top surface 140PU of the peripheral conductive line 140P, and the top surface 140CU of the cell conductive line 140C on the cell region CR and the peripheral circuit region PR of the substrate 100. The third interlayer insulating layer 150 may cover a top surface of the second protective insulating layer 135 on the cell region CR and the peripheral circuit region PR of the substrate 100.

Figure 7:
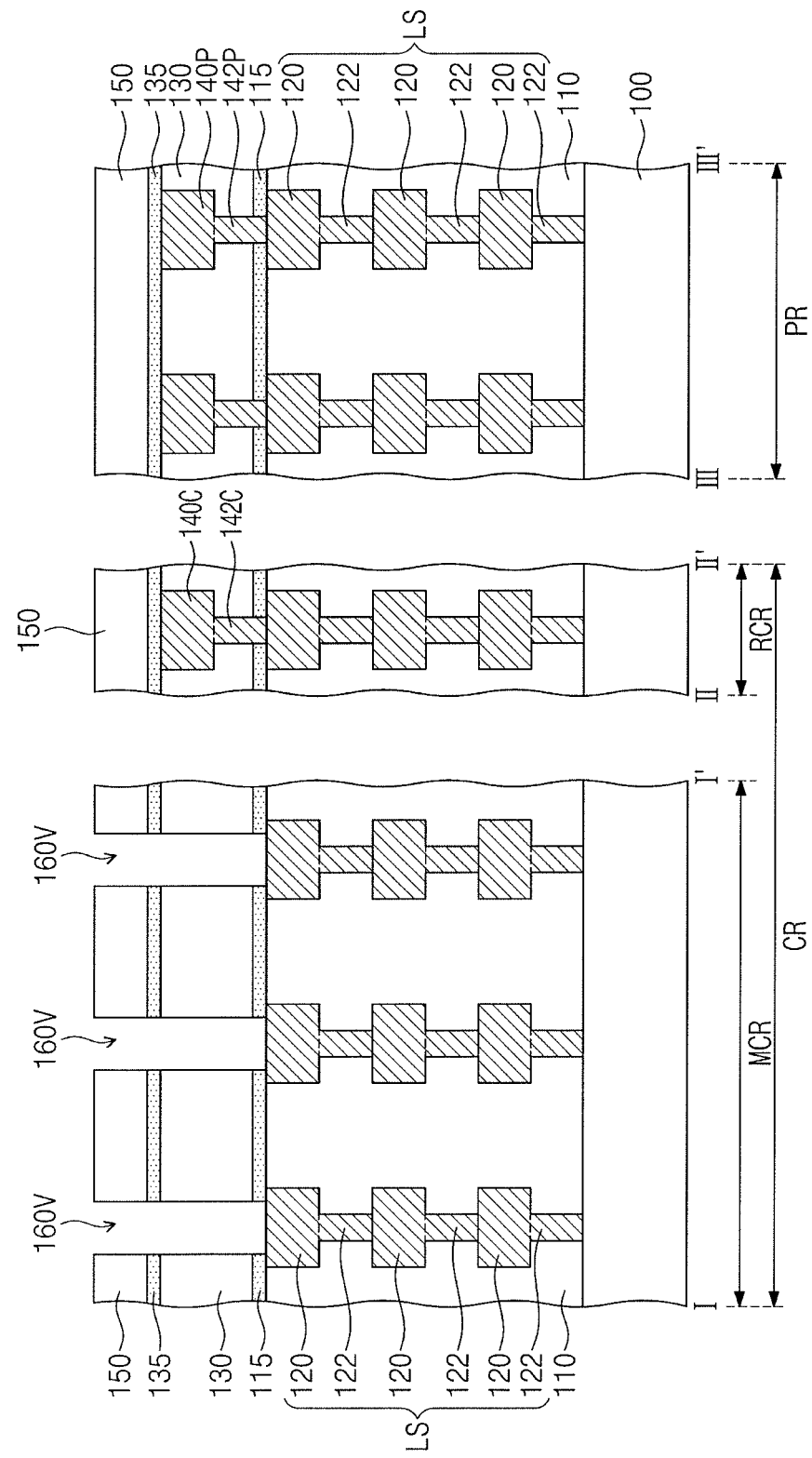

Referring to FIGS. 2 and 7, vertical holes 160V may be formed on the memory cell region MCR of the substrate 100. Each of the vertical holes 160V may penetrate the first protective insulating layer 115, the second interlayer insulating layer 130, the second protective insulating layer 135, and the third interlayer insulating layer 150 and may expose a top surface of a corresponding one of the uppermost interconnection lines 120. The vertical holes 160V may be spaced apart from each other in the first direction D1 and the second direction D2 when viewed in a plan view. For example, the formation of the vertical holes 160V may include forming a third mask pattern having openings defining the vertical holes 160V on the third interlayer insulating layer 150, and sequentially etching the third interlayer insulating layer 150, the second protective insulating layer 135, the second interlayer insulating layer 130, and the first protective insulating layer 115 by using the third mask pattern as an etch mask. The third mask pattern may be removed after the formation of the vertical holes 160V.

Figure 8:
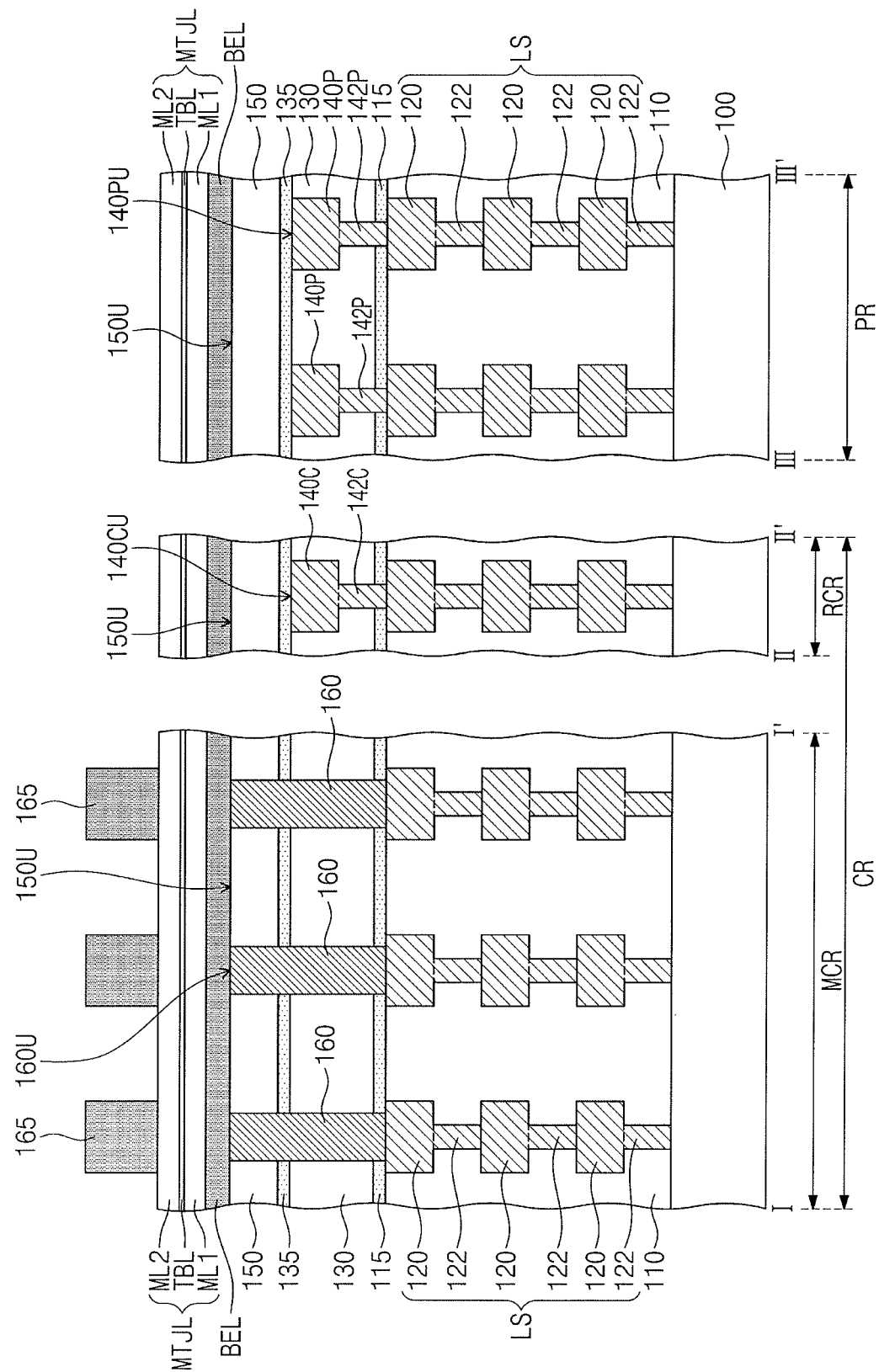

Referring to FIGS. 2 and 8, bottom electrode contacts 160 may be formed in the vertical holes 160V, respectively. The formation of the bottom electrode contacts 160 may include forming a conductive layer filling the vertical holes 160V on the third interlayer insulating layer 150, and planarizing the conductive layer until a top surface 150U of the third interlayer insulating layer 150 is exposed. Top surfaces 160U of the bottom electrode contacts 160 may be substantially coplanar with the top surface 150U of the third interlayer insulating layer 150 by the planarization process. The top surfaces 160U of the bottom electrode contacts 160 may be at a higher height than the top surface 140PU of the peripheral conductive line 140P and the top surface 140CU of the cell conductive line 140C.

A bottom electrode layer BEL and a magnetic tunnel junction layer MTJL may be sequentially formed on the third interlayer insulating layer 150. The magnetic tunnel junction layer MTJL may include a reference layer ML1, a tunnel barrier layer TBL and a free layer ML2, which are sequentially stacked on the bottom electrode layer BEL. The bottom electrode layer BEL and the magnetic tunnel junction layer MTJL may cover the top surface 150U of the third interlayer insulating layer 150 and the top surfaces 160U of the bottom electrode contacts 160, on the cell region CR and the peripheral circuit region PR of the substrate 100. Conductive mask patterns 165 may be formed on the magnetic tunnel junction layer MTJL that are on the memory cell region MCR. The conductive mask patterns 165 may be spaced apart from each other in the first direction D1 and the second direction D2 when viewed in a plan view. The conductive mask patterns 165 may define regions in which data storage patterns DS will be formed. The bottom electrode layer BEL and the conductive mask patterns 165 may include a conductive metal nitride (e.g., titanium nitride or tantalum nitride). The reference layer ML1, the tunnel barrier layer TBL and the free layer ML2 may include the same materials as the reference layer ML1, the tunnel barrier layer TBL and the free layer ML2 described with reference to FIGS. 4A and 4B, respectively.

Figure 9:
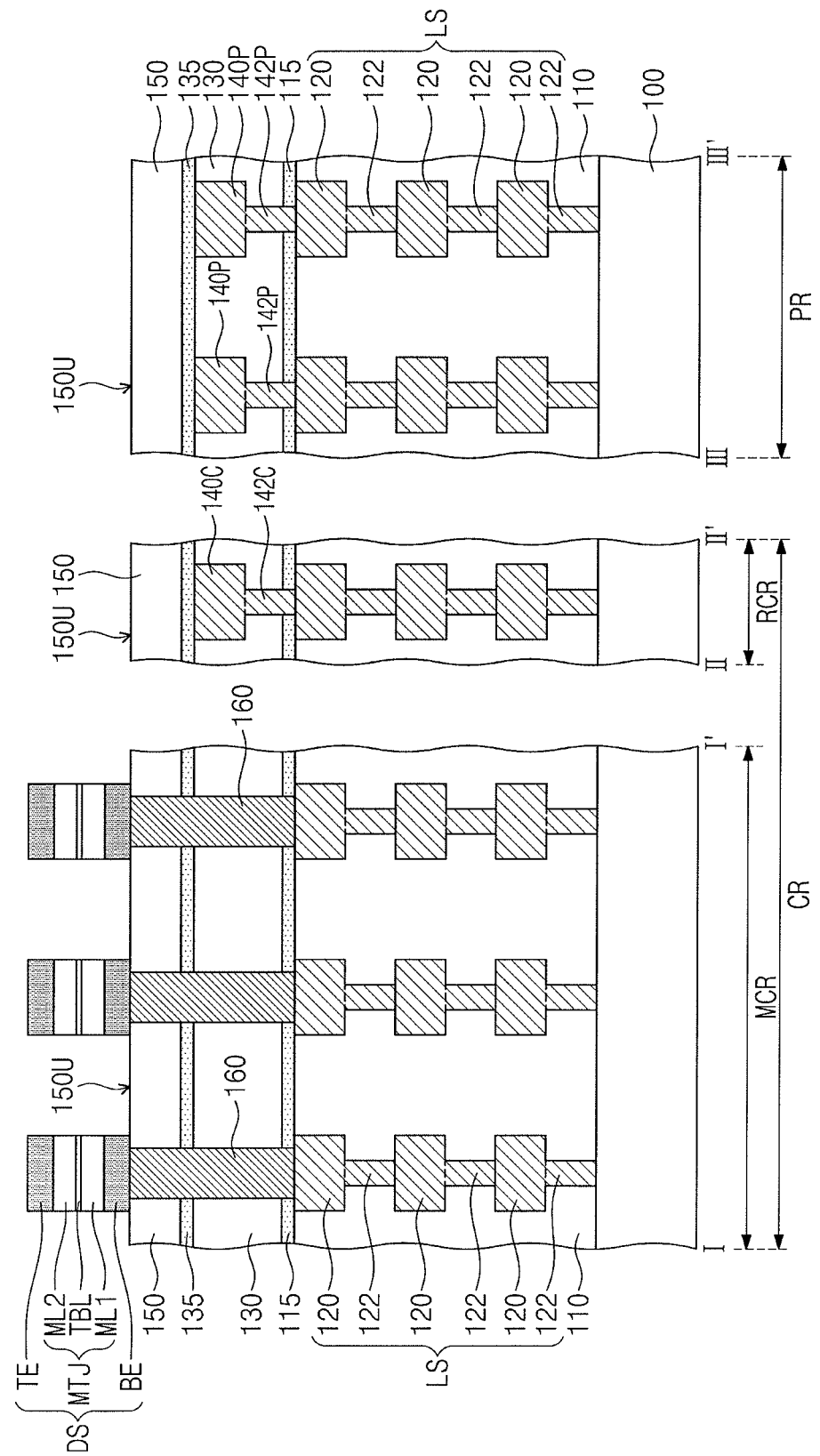

Referring to FIGS. 2 and 9, data storage patterns DS may be formed on the memory cell region MCR of the substrate 100. The formation of the data storage patterns DS may include sequentially etching the magnetic tunnel junction layer MTJL and the bottom electrode layer BEL by using the conductive mask patterns 165 as etch masks. The magnetic tunnel junction layer MTJL and the bottom electrode layer BEL may be etched to form a magnetic tunnel junction pattern MTJ and a bottom electrode BE, respectively. A portion of the conductive mask pattern 165, which remains on the magnetic tunnel junction pattern MTJ after the etching process, may function as a top electrode TE. Each of the data storage patterns DS may include the bottom electrode BE, the magnetic tunnel junction pattern MTJ and the top electrode TE, which are sequentially stacked on each of the bottom electrode contacts 160. The etching process of the magnetic tunnel junction layer MTJL and the bottom electrode layer BEL may be performed to expose the top surface 150U of the third interlayer insulating layer 150 between the data storage patterns DS on the memory cell region MCR and the top surface 150U of the third interlayer insulating layer 150 on the reference cell region RCR and the peripheral circuit region PR.

Figure 10:
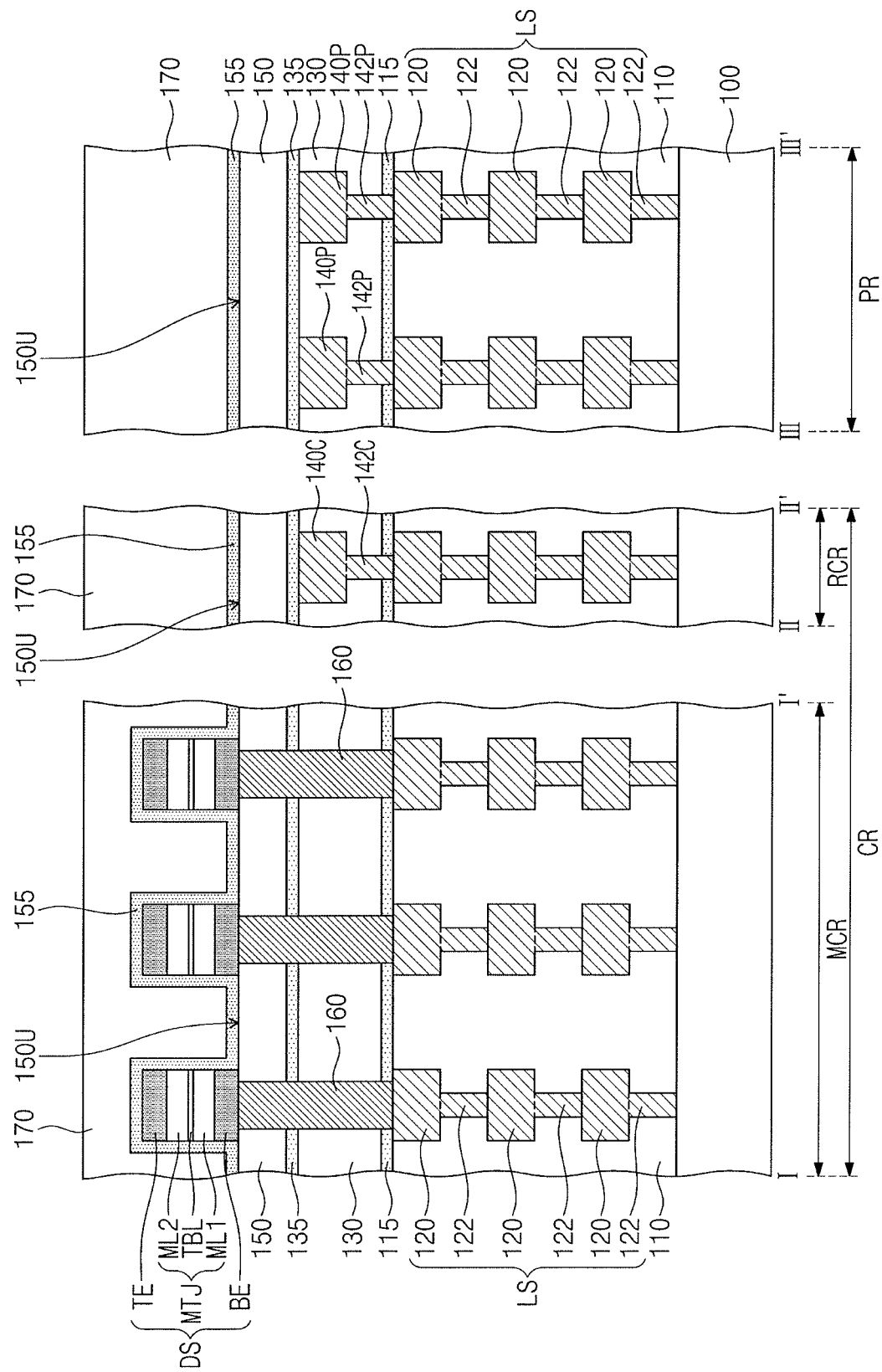

Referring to FIGS. 2 and 10, a capping insulating layer 155 and a fourth interlayer insulating layer 170 may be sequentially formed on the third interlayer insulating layer 150. The fourth interlayer insulating layer 170 may cover the data storage patterns DS and may cover the top surface 150U of the third interlayer insulating layer 150 on the cell region CR and the peripheral circuit region PR of the substrate 100. The capping insulating layer 155 may be between the fourth interlayer insulating layer 170 and a top surface of each of the data storage patterns DS and between the fourth interlayer insulating layer 170 and a sidewall of each of the data storage patterns DS. The capping insulating layer 155 may surround the sidewall of each of the data storage patterns DS when viewed in a plan view. The capping insulating layer 155 may extend from the sidewall of each of the data storage patterns DS into between the third interlayer insulating layer 150 and the fourth interlayer insulating layer 170. The capping insulating layer 155 may cover the top surface 150U of the third interlayer insulating layer 150 between the data storage patterns DS on the memory cell region MCR and may cover the top surface 150U of the third interlayer insulating layer 150 on the reference cell region RCR and the peripheral circuit region PR.

Figure 11:
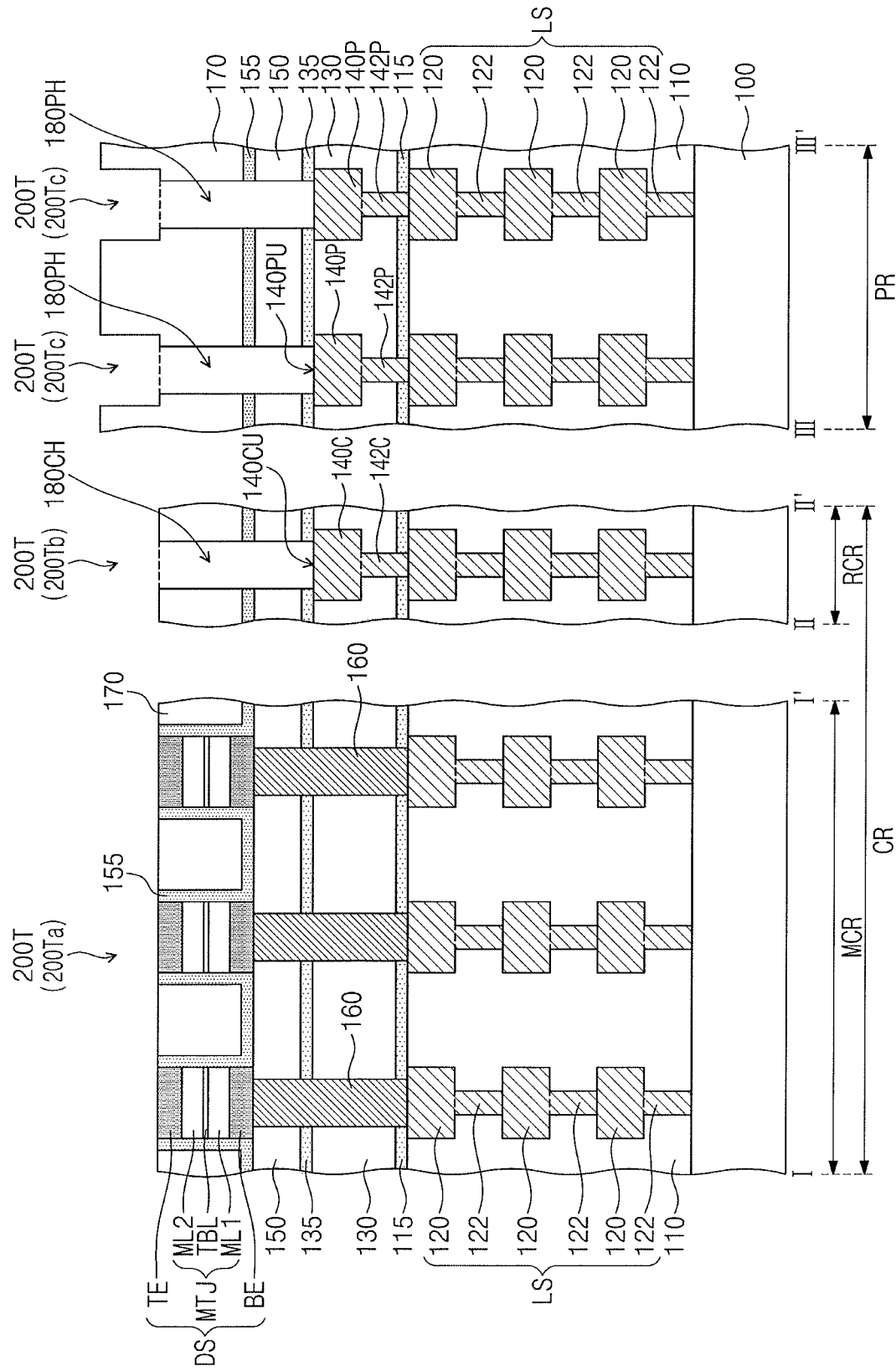

Referring to FIGS. 2 and 11, upper trenches 200T may be formed in the fourth interlayer insulating layer 170. The upper trenches 200T may include first upper trenches 200Ta formed in the fourth interlayer insulating layer 170 on the memory cell region MCR, a second upper trench 200Tb formed in the fourth interlayer insulating layer 170 on the reference cell region RCR, and a third upper trench 200Tc formed in the fourth interlayer insulating layer 170 on the peripheral circuit region PR. The first upper trenches 200Ta may extend in the first direction D1 and may be spaced apart from each other in the second direction D2. Each of the first upper trenches 200Ta may penetrate an upper portion of the fourth interlayer insulating layer 170 and may expose the top electrodes TE of the data storage patterns DS arranged in the first direction D1. In an implementation, each of the second and third upper trenches 200Tb and 200Tc may extend in the first direction D1. Each of the second and third upper trenches 200Tb and 200Tc may penetrate an upper portion of the fourth interlayer insulating layer 170. For example, the formation of the upper trenches 200T may include forming a fourth mask pattern having openings defining the upper trenches 200T on the fourth interlayer insulating layer 170, and etching an upper portion of the fourth interlayer insulating layer 170 by using the fourth mask pattern as an etch mask. The fourth mask pattern may be removed after the formation of the upper trenches 200T.

A cell contact plug hole 180CH may be formed on the reference cell region RCR of the substrate 100. The cell contact plug hole 180CH may extend downwardly from a bottom surface of the second upper trench 200Tb to penetrate the fourth interlayer insulating layer 170, the capping insulating layer 155, the third interlayer insulating layer 150, and the second protective insulating layer 135. The cell contact plug hole 180CH may expose the top surface 140CU of the cell conductive line 140C. A peripheral contact plug hole 180PH may be formed on the peripheral circuit region PR of the substrate 100. The peripheral contact plug hole 180PH may extend downwardly from a bottom surface of the third upper trench 200Tc to penetrate the fourth interlayer insulating layer 170, the capping insulating layer 155, the third interlayer insulating layer 150, and the second protective insulating layer 135. The peripheral contact plug hole 180PH may expose the top surface 140PU of the peripheral conductive line 140P. The cell contact plug hole 180CH and the peripheral contact plug hole 180PH may be formed at the same time. For example, the formation of the cell contact plug hole 180CH and the peripheral contact plug hole 180PH may include forming a sacrificial layer filling the upper trenches 200T on the fourth interlayer insulating layer 170, forming a fifth mask pattern having openings defining the cell and peripheral contact plug holes 180CH and 180PH on the sacrificial layer, and etching the sacrificial layer, a lower portion of the fourth interlayer insulating layer 170, the capping insulating layer 155, the third interlayer insulating layer 150, and the second protective insulating layer 135 by using the fifth mask pattern as an etch mask. The fifth mask pattern and the sacrificial layer may be removed after the formation of the cell contact plug hole 180CH and the peripheral contact plug hole 180PH.

Referring again to FIGS. 2 and 3, upper interconnection lines 200 may be formed in the upper trenches 200T, and a cell contact plug 180C and a peripheral contact plug 180P may be formed in the cell contact plug hole 180CH and the peripheral contact plug hole 180PH, respectively. The upper interconnection lines 200, the cell contact plug 180C and the peripheral contact plug 180P may be formed at the same time. For example, the formation of the upper interconnection lines 200, the cell contact plug 180C and the peripheral contact plug 180P may include forming a conductive layer filling the upper trenches 200T, the cell contact plug hole 180CH, and the peripheral contact plug hole 180PH on the fourth interlayer insulating layer 170, and planarizing the conductive layer until a top surface of the fourth interlayer insulating layer 170 is exposed. The conductive layer may include a metal (e.g., copper) and a conductive metal nitride.

Figure 12:
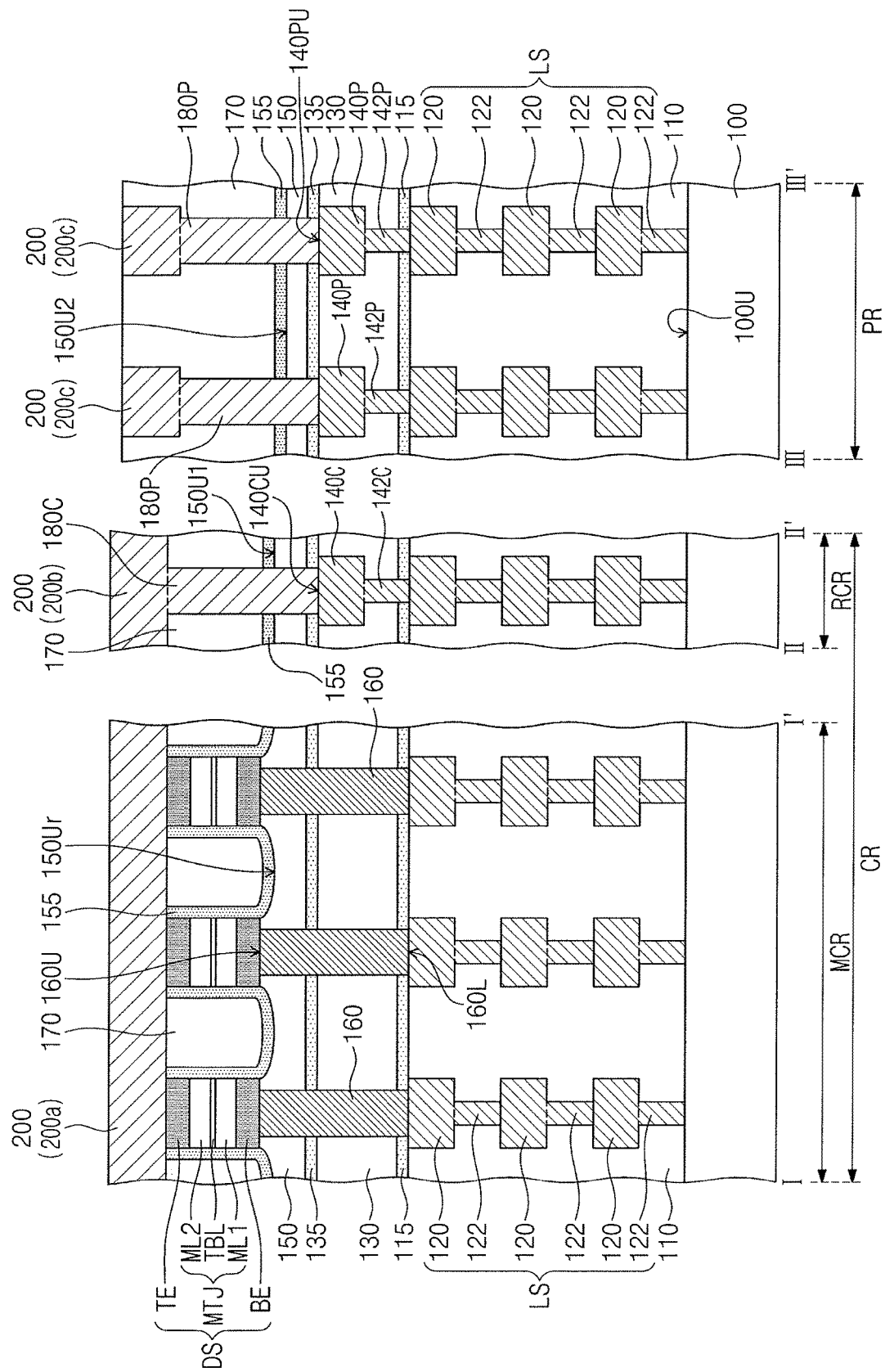
FIG. 12 illustrates cross-sectional views taken along the lines I-I', II-II' and III-III' of FIG. 2 showing a magnetic memory device according to some embodiments.

FIG. 12 illustrates a cross-sectional view taken along the lines I-I', II-II' and III-III' of FIG. 2 to show a magnetic memory device according to some embodiments. Hereinafter, differences between the present embodiments and the embodiments of FIGS. 2, 3, 4A and 4B will be mainly described for the purpose of ease and convenience in explanation.

Referring to FIGS. 2 and 12, the third interlayer insulating layer 150 on the memory cell region MCR may have a recessed top surface 150Ur between the data storage patterns DS. A top surface 150U1 of the third interlayer insulating layer 150 on the reference cell region RCR may be at substantially the same height as the recessed top surface 150Ur of the third interlayer insulating layer 150 on the memory cell region MCR. A top surface 150U2 of the third interlayer insulating layer 150 on the peripheral circuit region PR may be at a lower height than the recessed top surface 150Ur of the third interlayer insulating layer 150 on the memory cell region MCR and the top surface 150U1 of the third interlayer insulating layer 150 on the reference cell region RCR.

Top surfaces 160U of the bottom electrode contacts 160 may be at a higher height than the recessed top surface 150Ur of the third interlayer insulating layer 150 on the memory cell region MCR. The capping insulating layer 155 may conformally cover the recessed top surface 150Ur of the third interlayer insulating layer 150 between the data storage patterns DS and may extend along the top surface 150U1 of the third interlayer insulating layer 150 on the reference cell region RCR and the top surface 150U2 of the third interlayer insulating layer 150 on the peripheral circuit region PR. The capping insulating layer 155 may be between the fourth interlayer insulating layer 170 and the sidewall of each of the data storage patterns DS and between the fourth interlayer insulating layer 170 and the recessed top surface 150Ur of the third interlayer insulating layer 150. The capping insulating layer 155 may extend between the fourth interlayer insulating layer 170 and the top surface 150U1 of the third interlayer insulating layer 150 on the reference cell region RCR and between the fourth interlayer insulating layer 170 and the top surface 150U2 of the third interlayer insulating layer 150 on the peripheral circuit region PR.

Except for the differences described above, other features and components of the magnetic memory device according to the present embodiments may be substantially the same as corresponding features and components of the magnetic memory device according to the embodiments described with reference to FIGS. 2, 3, 4A and 4B.

Figure 13:
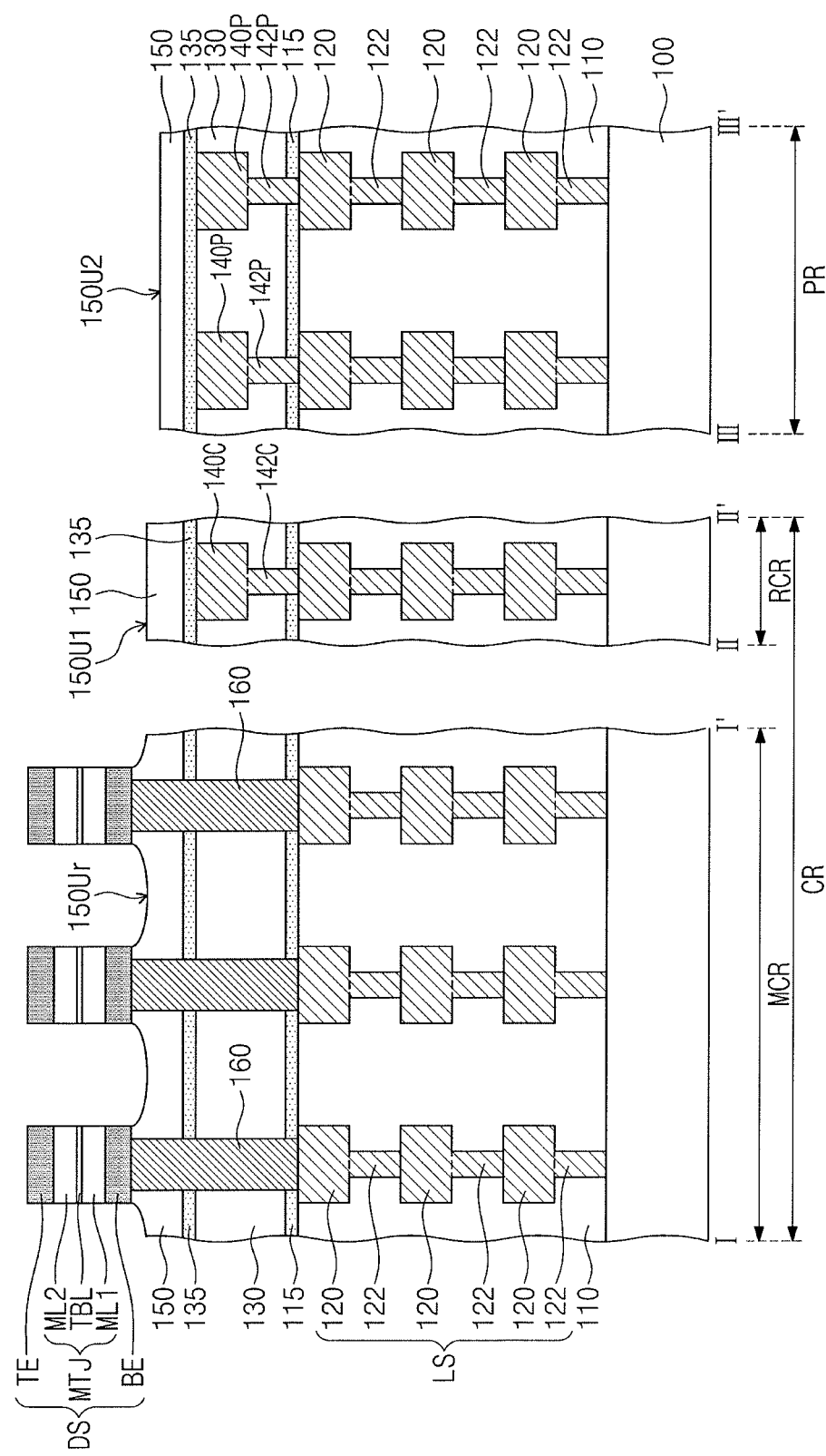
FIG. 13 illustrates cross-sectional views corresponding to the lines I-I', II-II' and of FIG. 2 showing stages in a method for manufacturing a magnetic memory device according to some embodiments.

FIG. 13 illustrates a cross-sectional view corresponding to the lines I-I', II-II' and III-III' of FIG. 2 to show a stage in a method for manufacturing a magnetic memory device according to some embodiments. Hereinafter, differences between the present embodiments and the embodiments of FIGS. 5 to 11 will be mainly described for the purpose of ease and convenience in explanation.

Referring to FIGS. 2 and 13, data storage patterns DS may be formed on the memory cell region MCR of the substrate 100. The formation of the data storage patterns DS may include sequentially etching the magnetic tunnel junction layer MTJL and the bottom electrode layer BEL by using the conductive mask patterns 165 as etch masks, as described with reference to FIG. 9. According to the present embodiments, an etching process of etching the magnetic tunnel junction layer MTJL and the bottom electrode layer BEL may include, e.g., an ion beam etching process using an ion beam. The ion beam may include ions of an inert gas. An upper portion of the third interlayer insulating layer 150 between the data storage patterns DS may be recessed by the etching process. Thus, the third interlayer insulating layer 150 on the memory cell region MCR may have a recessed top surface 150Ur between the data storage patterns DS. An upper portion of the third interlayer insulating layer 150 on the reference cell region RCR may be recessed by the etching process. A top surface 150U1 of the third interlayer insulating layer 150 on the reference cell region RCR may be at substantially the same height as the recessed top surface 150Ur of the third interlayer insulating layer 150 on the memory cell region MCR. In addition, an upper portion of the third interlayer insulating layer 150 on the peripheral circuit region PR may be recessed by the etching process. A top surface 150U2 of the third interlayer insulating layer 150 on the peripheral circuit region PR may be at a lower height than the recessed top surface 150Ur of the third interlayer insulating layer 150 on the memory cell region MCR and the top surface 150U1 of the third interlayer insulating layer 150 on the reference cell region RCR.

Except for the differences described above, other features and processes of the method for manufacturing the magnetic memory device according to the present embodiments may be substantially the same as corresponding features and processes of the method for manufacturing the magnetic memory device, described with reference to FIGS. 5 to 11.

By way of summation and review, highly integrated and/or low-power magnetic memory devices have been considered with the development of an electronic industry. Thus, various researches are being conducted.

The embodiments may provide a magnetic memory device capable of minimizing defects.

The embodiments may provide a magnetic memory device that can be easily manufactured.

According to the embodiments, the vertical heights of the bottom electrode contacts on the memory cell region may be maintained and at the same time, the aspect ratio of the cell and peripheral contact plugs on the reference cell region and the peripheral circuit region may be reduced. Thus, it is possible to minimize or prevent the defects which may be caused when the vertical height of the bottom electrode contact is reduced, and the cell and peripheral contact plugs may be easily formed. As a result, the magnetic memory device of which defects are minimized may be easily manufactured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A magnetic memory device, comprising:
   a substrate including a cell region and a peripheral circuit region;
   a first interlayer insulating layer covering the cell region and the peripheral circuit region of the substrate;
   interconnection lines in the first interlayer insulating layer;
   a peripheral conductive line and a peripheral conductive contact on the first interlayer insulating layer on the peripheral circuit region, the peripheral conductive contact being between the peripheral conductive line and a corresponding one of the interconnection lines;
   a bottom electrode contact on the first interlayer insulating layer on the cell region and connected to a corresponding one of the interconnection lines; and
   a data storage pattern on the bottom electrode contact, wherein:
   the peripheral conductive line is at a height between a top surface of the bottom electrode contact and a bottom surface of the bottom electrode contact,
   the cell region includes a memory cell region and a reference cell region,
   the bottom electrode contact and the data storage pattern are on the first interlayer insulating layer on the memory cell region, the magnetic memory device further includes a cell conductive line and a cell conductive contact on the first interlayer insulating layer on the reference cell region, the cell conductive contact is between the cell conductive line and a corresponding one of the interconnection lines, and the cell conductive line is at a height between the top surface of the bottom electrode contact and the bottom surface of the bottom electrode contact.

2. The magnetic memory device as claimed in claim 1, wherein:

the interconnection lines are at the same height from the substrate, the bottom surface of the bottom electrode contact is in contact with the corresponding one of the interconnection lines, and the data storage pattern is on the top surface of the bottom electrode contact.

3. The magnetic memory device as claimed in claim 1, further comprising a second interlayer insulating layer and a protective insulating layer sequentially stacked on the first interlayer insulating layer, wherein:

the bottom electrode contact penetrates the second interlayer insulating layer and the protective insulating layer, the peripheral conductive line and the peripheral conductive contact are in the second interlayer insulating layer, and the protective insulating layer covers a top surface of the peripheral conductive line.

4. The magnetic memory device as claimed in claim 3, further comprising a third interlayer insulating layer on the protective insulating layer, wherein:

the bottom electrode contact penetrates the third interlayer insulating layer, and the top surface of the bottom electrode contact is located at the same height as or a higher height than a top surface of the third interlayer insulating layer.

5. The magnetic memory device as claimed in claim 4, wherein the third interlayer insulating layer extends from the cell region onto the peripheral circuit region along a top surface of the protective insulating layer.

6. The magnetic memory device as claimed in claim 5, wherein a height of the top surface of the third interlayer insulating layer on the peripheral circuit region is lower than a height of the top surface of the third interlayer insulating layer on the cell region.

7. The magnetic memory device as claimed in claim 5, further comprising a capping insulating layer extending from a sidewall of the data storage pattern onto the top surface of the third interlayer insulating layer, wherein the capping insulating layer extends from the cell region onto the peripheral circuit region along the top surface of the third interlayer insulating layer.

8. The magnetic memory device as claimed in claim 7, further comprising:

a peripheral contact plug penetrating the capping insulating layer, the third interlayer insulating layer, and the protective insulating layer on the peripheral circuit region, the peripheral contact plug connected to the peripheral conductive line; and upper interconnection lines on the substrate, wherein:

the data storage pattern is between the bottom electrode contact and a corresponding one of the upper interconnection lines, and the peripheral contact plug is between the peripheral conductive line and a corresponding one of the upper interconnection lines.

9. The magnetic memory device as claimed in claim 1, wherein a top surface of the cell conductive line is located at substantially the same height as a top surface of the peripheral conductive line.

10. The magnetic memory device as claimed in claim 1, further comprising a second interlayer insulating layer, a protective insulating layer, and a third interlayer insulating layer sequentially stacked on the first interlayer insulating layer, wherein:

the bottom electrode contact penetrates the second interlayer insulating layer, the protective insulating layer, and the third interlayer insulating layer, the cell conductive line, the cell conductive contact, the peripheral conductive line and the peripheral conductive contact are in the second interlayer insulating layer, and the protective insulating layer covers top surfaces of the cell conductive line and the peripheral conductive line.

11. The magnetic memory device as claimed in claim 10, wherein:

a height of a top surface of the third interlayer insulating layer on the peripheral circuit region is lower than a height of a top surface of the third interlayer insulating layer on the memory cell region, and the height of the top surface of the third interlayer insulating layer on the peripheral circuit region is lower than a height of a top surface of the third interlayer insulating layer on the reference cell region.

12. A magnetic memory device, comprising:

a substrate including a cell region and a peripheral circuit region;

a first interlayer insulating layer covering the cell region and the peripheral circuit region of the substrate;

a lower interconnection structure in the first interlayer insulating layer;

a second interlayer insulating layer and a third interlayer insulating layer sequentially stacked on the first interlayer insulating layer;

a peripheral conductive line in the second interlayer insulating layer on the peripheral circuit region, the third interlayer insulating layer covering a top surface of the peripheral conductive line;

a bottom electrode contact penetrating the second interlayer insulating layer and the third interlayer insulating layer on the cell region, the bottom electrode contact having a top surface located at the same height as or a higher height than a top surface of the third interlayer insulating layer;

a data storage pattern on the top surface of the bottom electrode contact; and a capping insulating layer covering a sidewall of the data storage pattern and extending from the sidewall of the data storage pattern in the cell region onto the peripheral circuit region along the top surface of the third interlayer insulating layer.

13. The magnetic memory device as claimed in claim 12, further comprising:

a first protective insulating layer between the first interlayer insulating layer and the second interlayer insulating layer; and a second protective insulating layer between the second interlayer insulating layer and the third interlayer insulating layer, wherein:
the lower interconnection structure includes interconnection lines at the same height from the substrate,
the first protective insulating layer is in contact with top surfaces of the interconnection lines, and
the second protective insulating layer is in contact with the top surface of the peripheral conductive line.

14. The magnetic memory device as claimed in claim 13, wherein:
the bottom electrode contact penetrates the first and second protective insulating layers, and
a bottom surface of the bottom electrode contact is in contact with a top surface of a corresponding one of the interconnection lines.

15. The magnetic memory device as claimed in claim 14, further comprising a peripheral conductive contact in the second interlayer insulating layer on the peripheral circuit region,
wherein the peripheral conductive contact is between the peripheral conductive line and a corresponding one of the interconnection lines and connects the peripheral conductive line to the corresponding interconnection line.

16. The magnetic memory device as claimed in claim 12, wherein the data storage pattern includes a bottom electrode, a magnetic tunnel junction pattern and a top electrode, which are sequentially stacked on the top surface of the bottom electrode contact.

17. The magnetic memory device as claimed in claim 12, further comprising:
a fourth interlayer insulating layer on the third interlayer insulating layer; and
upper interconnection lines in the fourth interlayer insulating layer,
wherein:
the fourth interlayer insulating layer covers the data storage pattern and extends from the cell region onto the peripheral circuit region along the top surface of the third interlayer insulating layer, and
the data storage pattern is connected to a corresponding one of the upper interconnection lines.

18. The magnetic memory device as claimed in claim 17, further comprising a peripheral contact plug penetrating the third and fourth interlayer insulating layers on the peripheral circuit region so as to be connected to the peripheral conductive line,
wherein the peripheral contact plug is connected to a corresponding one of the upper interconnection lines.

19. A magnetic memory device, comprising:
a substrate including a cell region and a peripheral circuit region;
a first interlayer insulating layer covering the cell region and the peripheral circuit region of the substrate;
a second interlayer insulating layer and a protective insulating layer sequentially stacked on the first interlayer insulating layer;
a third interlayer insulating layer on the protective insulating layer;
interconnection lines in the first interlayer insulating layer;
a peripheral conductive line and a peripheral conductive contact on the first interlayer insulating layer on the peripheral circuit region, the peripheral conductive contact being between the peripheral conductive line and a corresponding one of the interconnection lines;
a bottom electrode contact on the first interlayer insulating layer on the cell region and connected to a corresponding one of the interconnection lines; and
a data storage pattern on the bottom electrode contact,
wherein:
the peripheral conductive line is at a height between a top surface of the bottom electrode contact and a bottom surface of the bottom electrode contact,
the bottom electrode contact penetrates the second interlayer insulating layer and the protective insulating layer,
the peripheral conductive line and the peripheral conductive contact are in the second interlayer insulating layer,
the protective insulating layer covers a top surface of the peripheral conductive line,
the bottom electrode contact penetrates the third interlayer insulating layer,
the third insulating layer has a top surface at an interface with a layer of a different material,
the top surface of the bottom electrode contact is located at the same height as or a higher height than the top surface of the third interlayer insulating layer,
the third interlayer insulating layer extends from the cell region onto the peripheral circuit region along a top surface of the protective insulating layer, and
a height of the top surface of the third interlayer insulating layer on the peripheral circuit region is lower than a height of the top surface of the third interlayer insulating layer on the cell region.

* * * * *